(12) United States Patent
Matsui

(10) Patent No.: US 8,212,153 B2
(45) Date of Patent: Jul. 3, 2012

(54) CIRCUIT BOARD AND MANUFACTURING METHOD OF THE CIRCUIT BOARD

(75) Inventor: Isao Matsui, Tokyo (JP)

(73) Assignee: NEC Corporation, Tokyo (JP)

( * ) Notice: Subject to any disclaimer, the term of this patent is extended or adjusted under 35 U.S.C. 154(b) by 1317 days.

(21) Appl. No.: 11/898,019

(22) Filed: Sep. 7, 2007

(65) Prior Publication Data

US 2008/0060837 A1    Mar. 13, 2008

(30) Foreign Application Priority Data

Sep. 8, 2006    (JP) ................. 2006-243553

(51) Int. Cl.
H05K 1/16    (2006.01)
(52) U.S. Cl. ....................... 174/262; 361/761
(58) Field of Classification Search ............ 361/761, 361/763; 174/262–266
See application file for complete search history.

(56) References Cited

U.S. PATENT DOCUMENTS 5,106,461 A * 4/1992 Volfson et al. ............. 205/125
6,388,208 B1 * 5/2002 Kiani et al. ................. 174/266

FOREIGN PATENT DOCUMENTS

| JP | 04-64278 | 2/1992 |
| JP | 5-347480 A | 12/1993 |
| JP | 6-069660 A | 3/1994 |
| JP | 08-186381 | 7/1996 |

OTHER PUBLICATIONS

Japanese Office Action dated Aug. 23, 2011 (only the translated relevant portion).

* cited by examiner

Primary Examiner — Jeremy Norris
(74) Attorney, Agent, or Firm — McGinn IP Law Group, PLLC

(57) ABSTRACT

A board comprises a through hole including a first opening, a second opening opposite to the first opening, a first conductor formed on a part of the through hole, the first conductor extends from the first opening to a first predetermined position of the through hole, a second conductor formed on a part of the through hole, the second conductor extends from the second opening to a second predetermined position nearer to the second opening than the first predetermined position, and wherein the first conductor alternates with the second conductor with respect to the circumferential direction of the through hole.

16 Claims, 7 Drawing Sheets

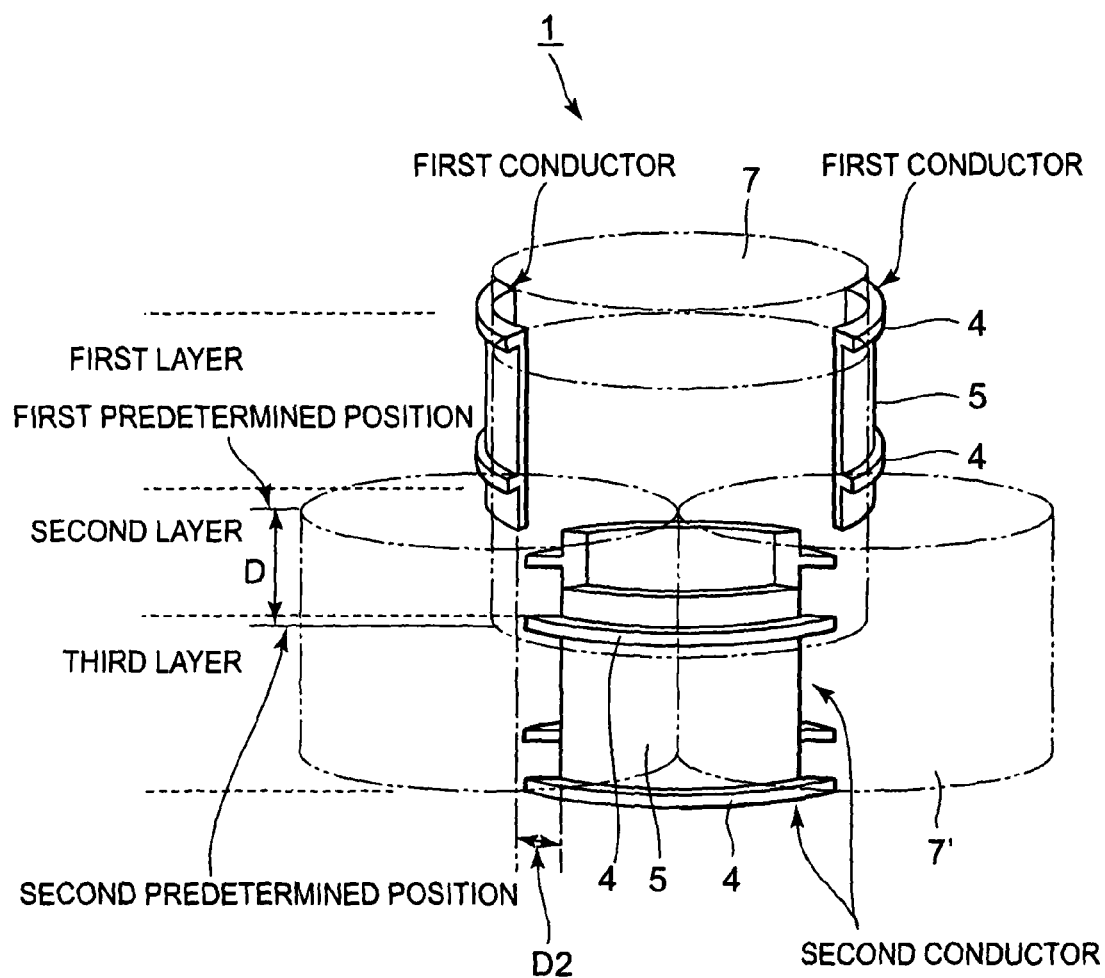

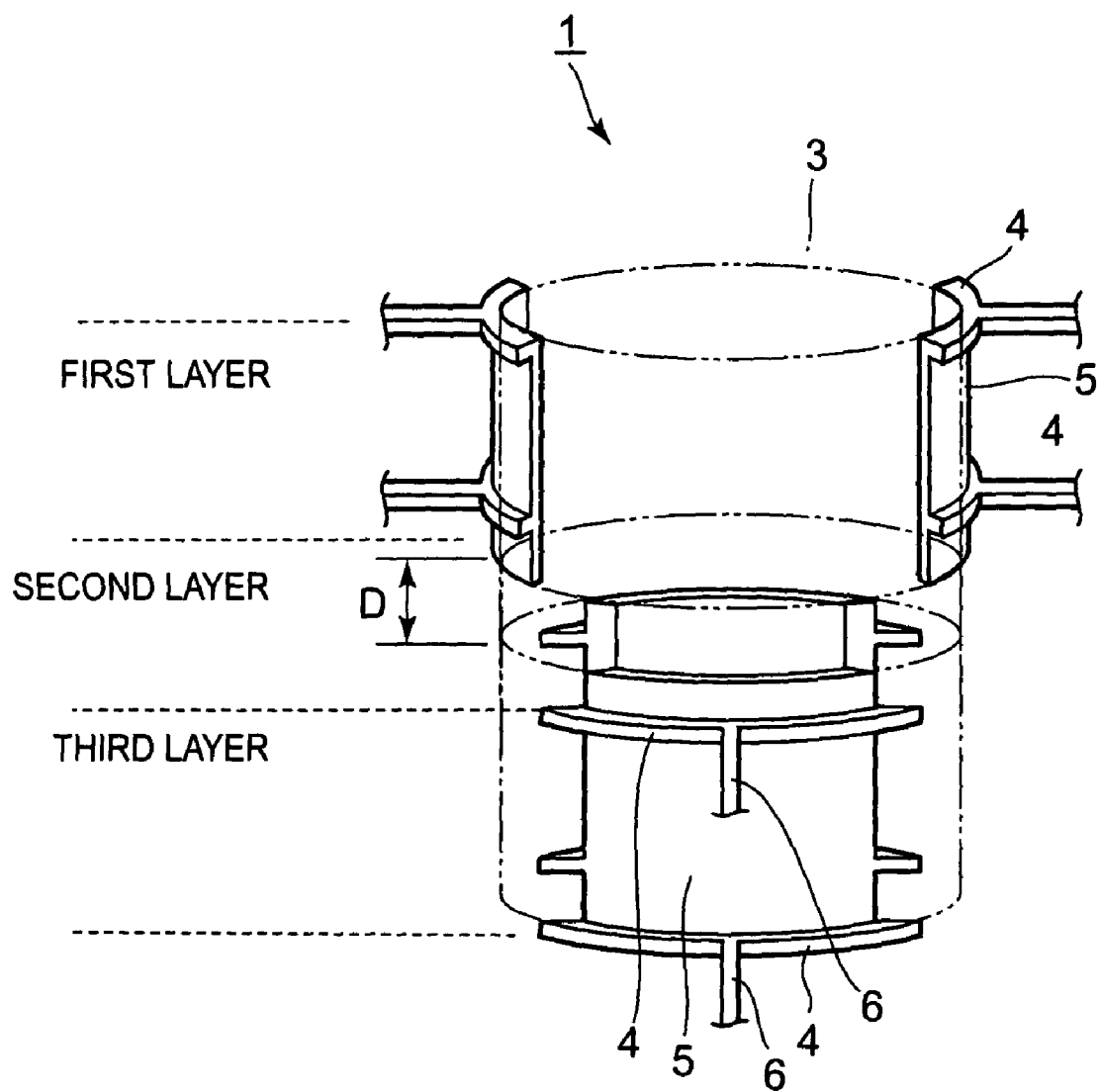

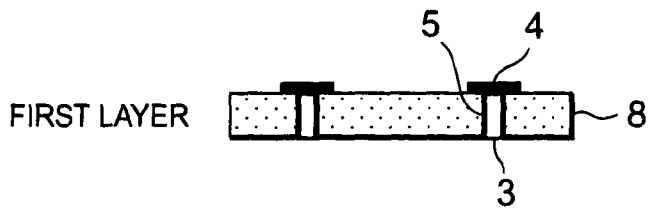
FIG. 6A
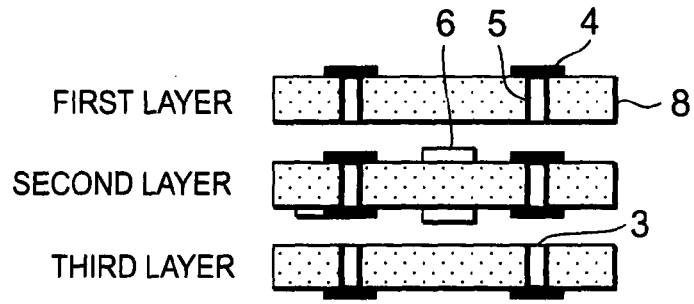
FIG. 6B
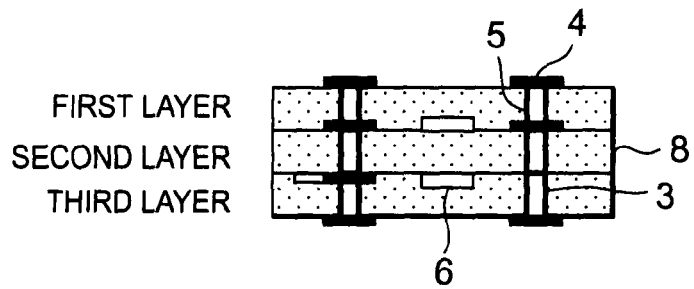
FIG. 6C
FIG. 6D
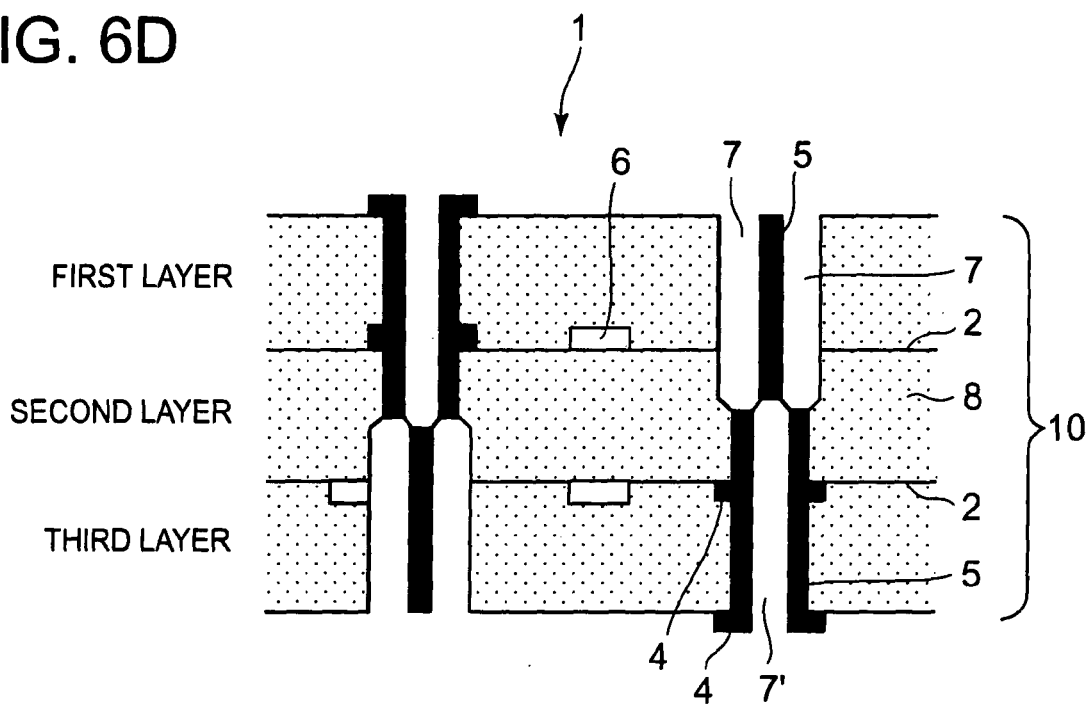

CIRCUIT BOARD AND MANUFACTURING METHOD OF THE CIRCUIT BOARD

BACKGROUND OF THE INVENTION

The present invention relates to a multilayer printed wiring board, and relates in particular to a multilayer printed wiring board including through holes.

In the related art, a through hole is used when a top layer and a bottom layer of a printed wiring board are connected each other. However, one signal circuit is permitted to be assigned to the through hole, in other words, the different signal circuits are not permitted to be assigned to one through hole. Therefore, an electronic component is not permitted to share the through hole with another electronic component, in other words it is not permitted to install the electronic component at an opening of the through hole and install another electronic component at another opening of the through hole, so it is impossible to mount the electronic components efficiently. As a countermeasure against the above mentioned situation, a build-up printed wiring board is used.

However, the build-up printed wiring board is limited by the number of layers that could be built up (stacked). Moreover, because of stacking each layer one by one, a long manufacturing time is required to produce the build-up printed wiring board.

A structure as shown in Laid-Open No. 4-64278 is used for making a printed wiring board with the objective of mounting electronic components at a high density. In the structure, by cutting land sections with a drill, the through hole is divided into a plurality of parts.

However, in the structure shown in Laid-Open No. 4-64278, the through hole is drilled from one side of the printed wiring board. And, the conductive element of the through hole is divided along a circumference of the through hole, but the conductive element of the through hole is not divided in an axial direction of the through hole. Therefore, it is impossible to install the electronic component at an opening of the through hole and install another electronic component at another opening of the through hole.

Another structure with the object of mounting electronic components at a high density is the structure shown in Laid-Open No. 8-186381. The structure shown in Laid-Open No. 8-186381 includes a large-diameter through hole and a small-diameter through hole. And, a conductive element of the large-diameter through hole and a conductive element of the small-diameter through hole are respectively isolated. Moreover, each of the conductive elements is divided along a circumference of each of the through holes, respectively. The structure was formed in the multilayer printed wiring board fabrication process by inserting a cross-shaped core and a washer into the through hole. More specifically, these cross-shaped cores are fabricated for the large-diameter through hole, and for the small-diameter through hole. An outside diameter of the washer corresponds to a diameter of the large-diameter through hole, and an inner diameter of the washer corresponds to a diameter of the small-diameter through hole. The washer, the cross-shaped cores are inserted into the through hole when the through hole is plated with a conductive material. A part corresponding to the washer, the cross-shaped cores is not plated with the conductive material. Therefore, the through hole is divided into a part with the conductive material and a part without the conductive material.

The structure shown in Laid-Open No. 8-186381 however possessed problems such as an increased number of fabrication processes due to dividing the conducting element in the processing to laminate the multilayer printed wiring board layers.

Another structure relating to through holes is disclosed in Laid-Open No. 2002-64255. However the structure shown in Laid-Open No. 2002-64255 is designed to lower the inductance of the connecting conductive piece in order to stabilize the signal processing circuit operation. And, in the structure shown in Laid-Open No. 2002-64255, the conductive element of the through hole is divided along a circumference of the through hole. So, it is impossible to install the electronic component at an opening of the through hole and install another electronic component at another opening of the through hole.

SUMMARY OF THE INVENTION

An object of the present invention is to solve the problems of the related art, and in particular to provide a printed wiring board capable of mounting the electronic components efficiently.

A board comprises a through hole including a first opening, a second opening opposite to the first opening, a first conductor formed on a part of the through hole, the first conductor extends from the first opening to a first predetermined position of the through hole, a second conductor formed on a part of the through hole, the second conductor extends from the second opening to a second predetermined position nearer to the second opening than said first predetermined position, and wherein the first conductor alternates with the second conductor with respect to the circumferential direction of the through hole.

An apparatus including a board, the board comprises a through hole including a first opening, a second opening opposite to the first opening, a first conductor formed on a part of the through hole, the first conductor extends from the first opening to a first predetermined position of the through hole, a second conductor formed on a part of the through hole, the second conductor extends from the second opening to a second predetermined position nearer to the second opening than the first predetermined position, and wherein the first conductor alternates with the second conductor with respect to the circumferential direction of the through hole.

A method for manufacturing a board comprises forming a through hole including a first opening, a second opening opposite to the first opening, and a conductive wall, drilling a first hole so that a first part of the conductive wall is cut by the first hole, the first hole extends from the first opening to a first predetermined position of the through hole, and drilling a second hole so that a second part of the conductive wall is cut by the second hole, the second hole extends from the second opening to a second predetermined position nearer to the first opening than the first predetermined position, the second hole is formed so that the first part and the second part are continuous with respect to a circumferential direction of the through hole.

BRIEF DESCRIPTION OF THE DRAWINGS

Other features and advantages of the invention will be made more apparent by the following detailed description and the accompanying drawings, wherein:

FIG. 4 is a drawing for illustrating a positional relationship of a cut hole, a land and a conductive wall of the first exemplary embodiment;

FIG. 5 is a drawing for showing the conductive wall and the land of the first exemplary embodiment;

FIG. 6A is drawing for illustrating a process sequence in a method for manufacturing the printed wiring board;

FIG. 6B is drawing for illustrating the process sequence in the method for manufacturing the printed wiring board;

FIG. 6C is drawing for illustrating the process sequence in the method for manufacturing the printed wiring board;

FIG. 6D is drawing for illustrating the process sequence in the method for manufacturing the printed wiring board;

In the drawings, the same reference numerals represent the same structural elements.

DETAILED DESCRIPTION OF THE PREFERRED EMBODIMENTS

In the present invention, a cut hole is formed by cutting a section of the conductive wall towards the interior from at least one of the top or bottom opening of the printed wiring board, to divide the conductive wall in a axial direction of the through hole. A structure of the printed wiring board and a method of manufacturing the printed wiring board are described with reference to an exemplary embodiments.

Figure 1:
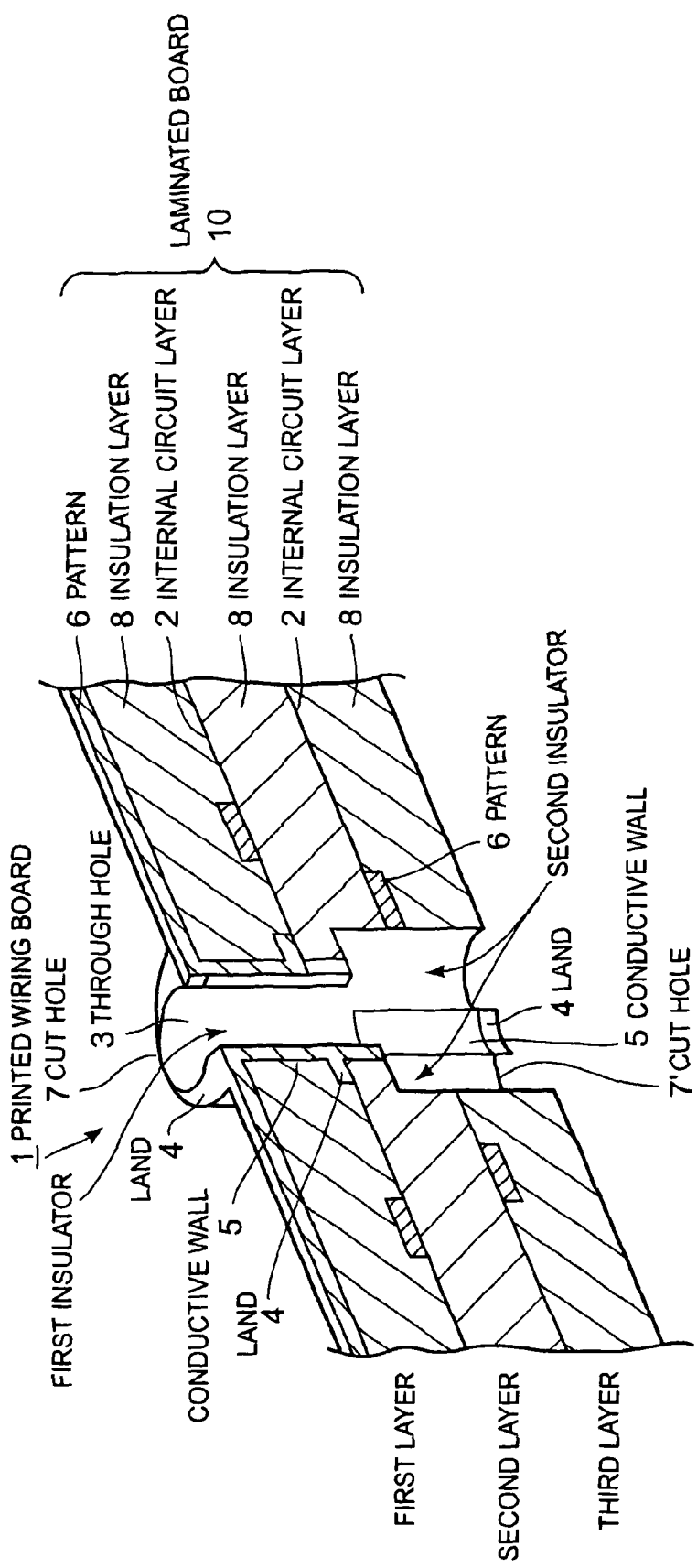
FIG. 1 is a cross sectional views showing a through hole of a first exemplary embodiment.
Figure 2:
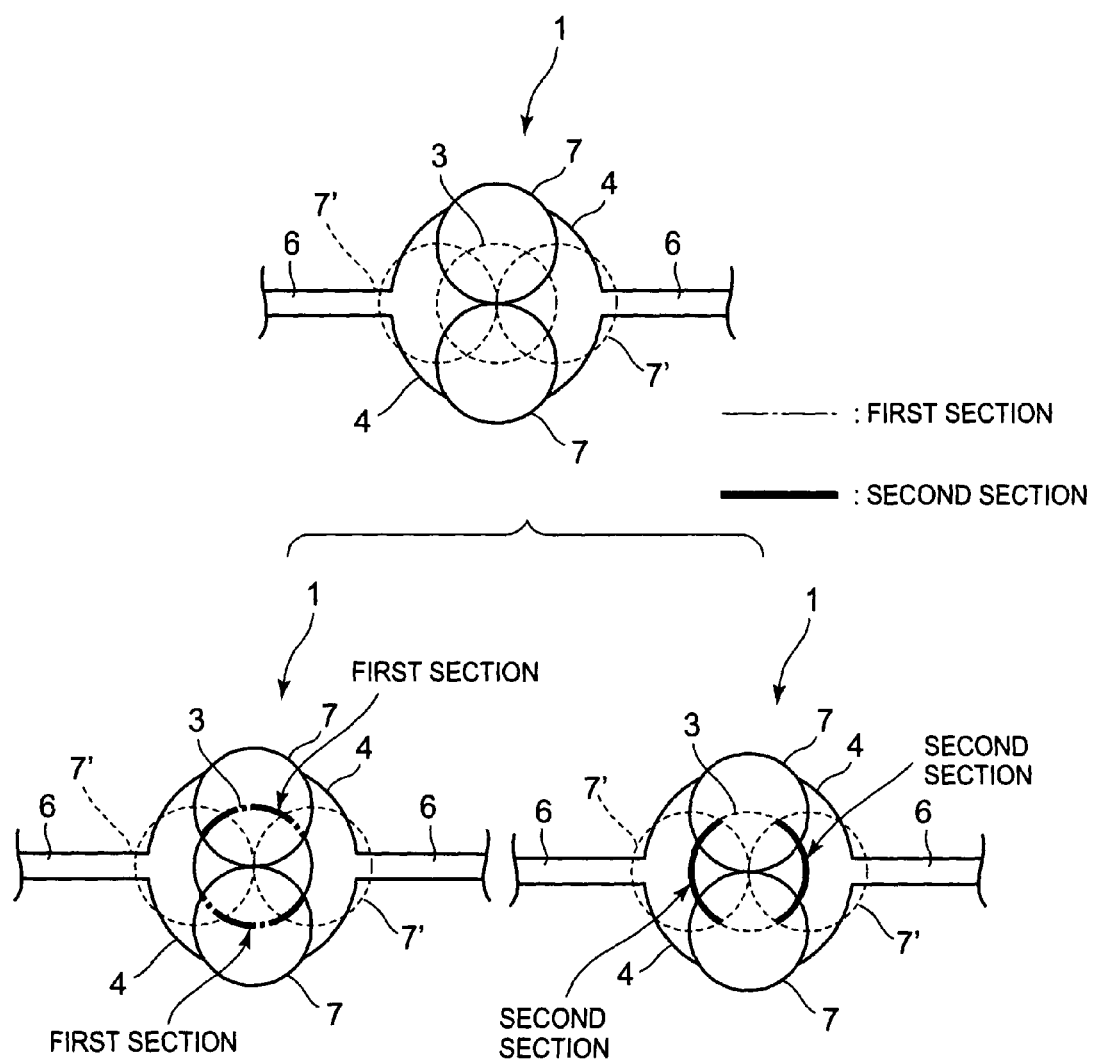
FIG. 2 is an upper view of the through hole of the first exemplary embodiment.
Figure 3:
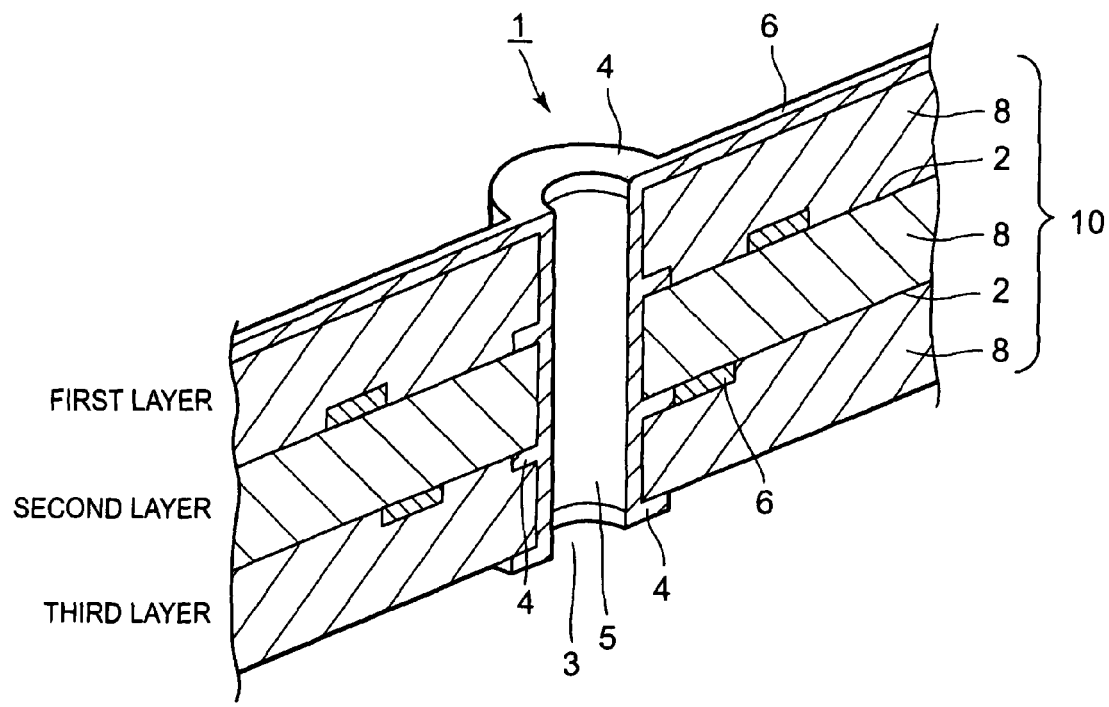
FIG. 3 is across sectional views showing the through hole of the first exemplary embodiment.

A first embodiment of the present invention is described with reference to FIG. 1 through FIG. 6. FIG. 1 is a cross sectional views showing the through hole 3 including a cut hole 7. FIG. 2 is an upper view of the through hole 3 including the cut hole 7. FIG. 3 is a cross sectional view showing the through hole 3 without the cut hole 7. FIG. 4 is a drawing for illustrating the positional relationship of the cut hole 7, a land 4 and a conductive wall 5. FIG. 5 is a drawing showing the structure of the conductive wall 5 and the land 4. FIG. 6 is drawings for illustrating the process sequence in the method for manufacturing the printed wiring board 1.

In the multilayer printed wiring board 1 of this invention, an insulation layer 8, and an internal circuit layer 2 are positioned alternately, and stacked (laminated) together to form the laminated board 10 as shown in FIG. 1 through FIG. 3. For example, the printed wiring board 1 includes an insulation layer 8 forming (first layer through third layer) three layers within the laminated board 10, and an internal circuit layer 2 between each layers (between the first layer and second layer, and between the second layer and third layer). The through hole 3 piercing substantially perpendicularly through the laminated board 10, are formed at optional position on the printed wiring board 1.

The through hole 3 includes a first opening and a second opening, the second opening is at an opposite side with respect to the first opening.

A land 4 is formed at the first opening and the second opening of the through hole 3. And, the land 4 is formed at the internal circuit layer 2. A conductive wall 5 is formed on the interior wall of the through hole 3 for connecting the lands 4.

A first insulator and a second insulator are formed on the interior wall of the through hole 3. Apart of the conductive wall 5 is insulated by the first and second insulator. For example, the first and second insulators comprise cut holes 7, 7'. The cut holes 7 and 7' cut the conductive wall 5 for insulating a part of the conductive wall 5. For example, the cut hole 7 is formed on the part of the interior wall of the through hole 3, the part is cut by the cut hole 7. The cut hole 7 is extending from the first opening to an inside of the through hole 3. For example, the cut hole 7' is formed on the part of the interior wall of the through hole 3, the part is cut by the cut hole 7'. The cut hole 7' is extending from the second opening to an inside of the through hole 3. In the printed wiring board 1 of the first exemplary embodiment, the insulation layers 8 and the internal circuit layers 2 were described as being alternately positioned and laminated (stacked) together within laminated board 10. However that description is merely an example and the insulation layers 8 and the internal circuit layers 2 need not be all laminated together and may be stacked as one layer each.

The laminated board 10 is, for example, a dual-sided board. Electronic components are mounted on the laminated board 10. The printed wiring board 1 of the first exemplary embodiment includes insulation layers 8 and the internal circuit layers 2 are alternately positioned within the laminated board 10 as described later on.

The insulation layer 8 is uses when the printed wiring board is formed, etc. The insulation layer 8 and the internal circuit layer 2 are positioned alternately within the printed wiring board 1. In the first exemplary embodiment, the insulation layer 8 is formed in three layers (first layer through third layer) within the laminated board 10. However, this description is merely an example, and the insulation layer 8 is not limited to being laminated in three layers within the laminated board 10.

The pattern 6 forms a wiring circuit. The pattern 6 forms the internal circuit layers 2 and the circuits on the top and bottom surfaces of the laminated board 10, and connects to the lands 4.

The internal circuit layer 2 is a wiring circuit formed from the pattern 6. For example, the internal circuit layer 2 connects between electronic components (not shown in drawing) mounted on the printed wiring board 1. Two internal circuit layers 2 (between the first layer and second layer, between the second layer and third layer) are formed internally in the laminated board 10 as shown in FIG. 1. The lands 4 are formed at specific positions within the internal circuit layer 2. The internal circuit layers 2 are connected each other by connecting the pattern 6, land 4 and the conductive wall 5. An example where two internal circuit layers 2 were formed was described in the first exemplary embodiment, however the present invention is not limited to the example, and it may be possible to form more internal circuit layers 2.

The through hole 3 is, for example, a cylindrical hole piercing through the printed wiring board 1. The through hole 3 is piercing through from a top surface to a bottom surface. The through hole 3 is formed by bellow mentioned processes, for example. First, a hole is formed at each of the insulation layer 8 of the laminated board 10. Second, the insulation layer 8 is stacked so that the holes is located at the identical position each other. The stacked holes comprise the through hole 3. Third, the land 4 is formed at the first opening and the second opening of the through hole 3 as shown in FIG. 3. Forth, the conductive wall 5 is formed on the interior wall of the through hole 3. In other words, the through hole 3 connects the top surface and the bottom surface electrically with the land 4 and the conductive wall 5. Fifth, the first insulator and the second insulator are formed on the interior wall of the through hole 3. As shown in FIG. 1, for example, the cut holes 7, 7' are formed at the part of the conductive wall 5, the cut holes 7, 7' cut the part of the conductive wall 5 and the land 4 as shown in FIG. 4. The abovementioned first and second steps are exemplary example steps. However the present invention is not limited to these steps, and the through holes 3 may be formed after stacking together the layers of the printed wiring board 1.

The land 4 is, for example, a conductive piece in a ring shape. The land 4 is connected to the pattern 6 on the laminated board 10 and the internal circuit layers 2. The land 4 is formed in each layer at the through hole 3 and at the first opening and the second opening. The lands 4 corresponding to one through hole 3 are connected through the conductive walls 5. As shown in FIG. 2 and FIG. 5, the cut holes 7 and 7' cut the lands 4 corresponding to one through hole 3 while leaving connecting points connected to the pattern 6. In other words, the cut holes 7, 7' cut the lands 4 except the connecting points. The cut hole 7 corresponds to the first insulator, and the cut hole 7' corresponds to the second insulator. In FIG. 2, two cut holes 7 and two cut holes 7' are shown. However, the number of the cut hole 7 and the cut hole 7' are not limited two. As shown in FIG. 2, the interior wall of the through hole 3 are divided into two sections (a first section and a second section). The first section is insulated by the cut hole 7. The second section is insulated by the cut hole 7'. The first section corresponds to a part of the interior wall of the through hole 3, the second section corresponds to the other part of the interior wall of the through hole 3. In other words, the first section covers the rest of part of the interior wall covered with the second section. The whole part of the interior wall of the through hole 3 is covered with the first section and the second section. Moreover, it is possible that apart of the first section overlaps with apart of the second section. The signal circuits connected to the lands 4 is isolated by the cut holes 7 and 7'.

The conductive wall 5 in the interior wall of the through hole 3 is plated with a conductive element. The conductive wall 5 connects the lands 4 formed at the first and second openings of the through hole 3 as shown in FIG. 3. The cut holes 7 and 7' cut a part of the conductive wall 5 respectively as shown in FIG. 4 and FIG. 5. The cut hole 7 cuts the part corresponding to the first section, and the cut hole 7' cuts the part corresponding to the second section. In FIG. 4 and FIG. 5, the conductive wall 5 is divided into four isolated parts within the through hole 3. The two isolated parts formed on the second section are opposed with each other, and the other two isolated parts formed on the first section are opposed with each other. The two isolated parts formed on the second section is a second conductor, and the two isolated parts formed on the first section is a first conductor. In FIG. 4, the first and second conductors are isolated two parts, respectively. However, it is possible that the first and second conductors comprise more isolated parts, respectively. Further, it is possible that the first and second conductors comprise one part, respectively. And, the first conductor and the second conductor are separated each other by the distance D2 in the circumferential direction of the through hole 3. The relation of positions of the cut holes 7 and 7' is shown in FIG. 2, the upper view of the cut holes 7 and 7' is shown in FIG. 2. A position of the second conductor corresponds to a position rotated by substantially 90-degree angle with respect to the first conductor. The cut hole 7 is extending from the first opening to a second predetermined position of the interior wall of the through hole 3. The cut hole 7' is extending from the second opening to a first predetermined position of the interior wall of the through hole 3. The first and second predetermined position is at an inside of the through hole 3. The second predetermined position is nearer to the second opening than the first predetermined position. The distance between the first and second predetermined position is D as shown in FIG. 4 and FIG. 5. In other words, the first conductor and the second conductor are isolated by the distance D in the axial direction of the through hole 3, therefore, the first and second conductor are insulated each other. Because the conductive wall 5 is divided in the axial direction of the through hole 3, the different signal circuits can be assigned to the first and second conductor, respectively. Impedance matching can be performed within the through hole 3 by assigning a power supply signal to one of the two conductive wall of the first or second conductor. The example given for the first exemplary embodiment described dividing the conductive wall 5 within the second layer of the printed wiring board 1. However, the invention is not limited to this example and this division may be changed according to the number of layers of printed wiring board 1. Moreover the example described the case where the conductive wall 5 was divided into 4 parts within the through hole 3. However that description is merely an example and invention need not be limited to the four parts if these are respectively isolated and subdivided.

The cut holes 7 and 7' are holes formed using a drill and that do not penetrate through the board, for example. The cut holes 7 and 7' are formed on the land 4, for example. The cut hole 7 is extending from the first opening to the first predetermined position, for example. The cut hole 7' is extending from the second opening to the second predetermined position, for example. For example, the cut hole 7 and 7' comprise two holes of the same diameter, respectively. Moreover, the cut holes 7 and 7' are formed substantially perpendicularly with respect to the surface of the laminated board 10 along the through hole 3. The land 4 and the conductive wall 5 are divided into four isolated parts with the cut holes 7 and 7'. The cut hole 7 is formed at the first section of the through hole 3 as shown in FIG. 2. The cut hole 7' is formed at the second section of the through hole 3 as shown in FIG. 2. The cut hole 7 is formed at the first opening of the through hole 3 as shown in FIG. 2, the cut hole 7 is shown by the solid line in FIG. 2. The cut hole 7' is formed at the second opening of the through hole 3 as shown in FIG. 2, the cut hole 7' is shown by the dotted line in FIG. 2. The two holes of the cut hole 7 are opposed to each other. The two holes of the cut hole 7' are opposed to each other. A diameter of the cut holes 7 and 7' is the same diameter of the through hole 3, for example. A position of the cut hole 7' corresponds to a position rotated by substantially 90-degree angle with respect to the cut hole 7. The cut holes 7 and 7' reach to the second layer of the printed wiring board 1. The cut holes 7 and 7' are superposed at the second layer, the length of the superposed part is D as shown in FIGS. 4 and 5. A part of the conductive wall 5 corresponding to the superposed part is insulated entirely with the cut holes 7 and 7'. In other words, the part of the conductive wall 5 corresponding to the superposed part is entirely cut by the cut hole 7 and 7'. In the first exemplary embodiment, the case was described where the cut holes 7 and 7' were drilled holes but this description is merely an example and other methods may be utilized if the land 4 and conductive wall 5 can be insulated, without piercing through all the layers of the printed wiring board 1. Also, the number of the cut holes 7 and 7' is not limited to the above mentioned number, and the size of the cut holes 7 and 7' is not limited to the same size as the through hole 3. Moreover, the direction of the cut holes 7 and 7' is not limited to being formed substantially perpendicular to the board surface of the laminated board 10 as long as the land 4 and conductive wall 5 are divided.

The method for manufacturing the printed wiring board 1 of the first exemplary embodiment is described referring to FIG. 6A through FIG. 6D. First, as shown in FIG. 6A, the through hole 3, the land 4, the conductive wall 5, and the pattern 6 are formed beforehand on the insulation layer 8 which becomes an each layer of the printed wiring board 1. Second, as shown in FIG. 6B, each layer is positioned so that the through holes 3 of each layer is connected each other. Third, as shown in FIG. 6C, each layers are stacked (laminated) together to form the printed wiring board 1. Forth, as shown in FIG. 6D, the cut holes 7 and 7' are formed by drilling at the first section and the second section, respectively.

The cut holes 7 and 7' are formed at the first section and the second section, the signal assigned to the first section is different to the signal assigned to the second section. The cut hole 7 comprises two holes having the same diameter, the two holes are extending from the first opening to the first predetermined position substantially perpendicularly to the surface of the laminated board 10. The cut hole 7' comprises two holes having the same diameter, the two holes are extending from the second opening to the second predetermined position substantially perpendicularly to the surface of the laminated board 10. The two holes of the cut hole 7, as shown by the solid line in FIG. 2, are formed at the land 4 of the first opening, respectively. The two holes of the cut hole 7', as shown by the dotted line in FIG. 2, are formed at the land 4 of the second opening, respectively. The two holes of the cut hole 7' is formed at the position rotated 90-degree with respect to the cut hole 7. The cut holes 7 and 7' are superposed at the second layer, the length of the superposed part is D. The cut holes 7 and 7' cut the part of the conductive wall 5 corresponding to the superposed part, therefore, the part of the conductive wall 5 corresponding to the superposed part is insulated entirely with the cut holes 7 and 7'. The cut holes 7 and 7' also cut the land 4 formed at the first and second openings of the through hole 3, so, the conductive wall 5 is insulated along the axial direction of the through hole 3. Four different signal circuits can then be connected within one through hole 3 as shown in FIG. 5, by connecting the four divided conductive wall 5 sections to the pattern 6 on each layer. The impedance of the conductive wall 5 corresponding to the first section can be adjusted by connecting a power signal to one part of the conductive wall 5 corresponding to the first section. In other words, by connecting the power signal to one part of the conductive wall 5 corresponding to the first section, the mutual induction occurs and then the electrical current is canceled each other out. The impedance of the conductive wall 5 corresponding to the second section can be adjusted by connecting a power signal to one part of the conductive wall 5 corresponding to the second section. In other words, by connecting the power signal to one part of the conductive wall 5 corresponding to the second section, the mutual induction occurs and then the electrical current is canceled each other out. Since different signal circuits can be connected to the through hole 3, different electronic components can be mounted at identical top and bottom positions on the printed wiring board 1.

Figure 7:
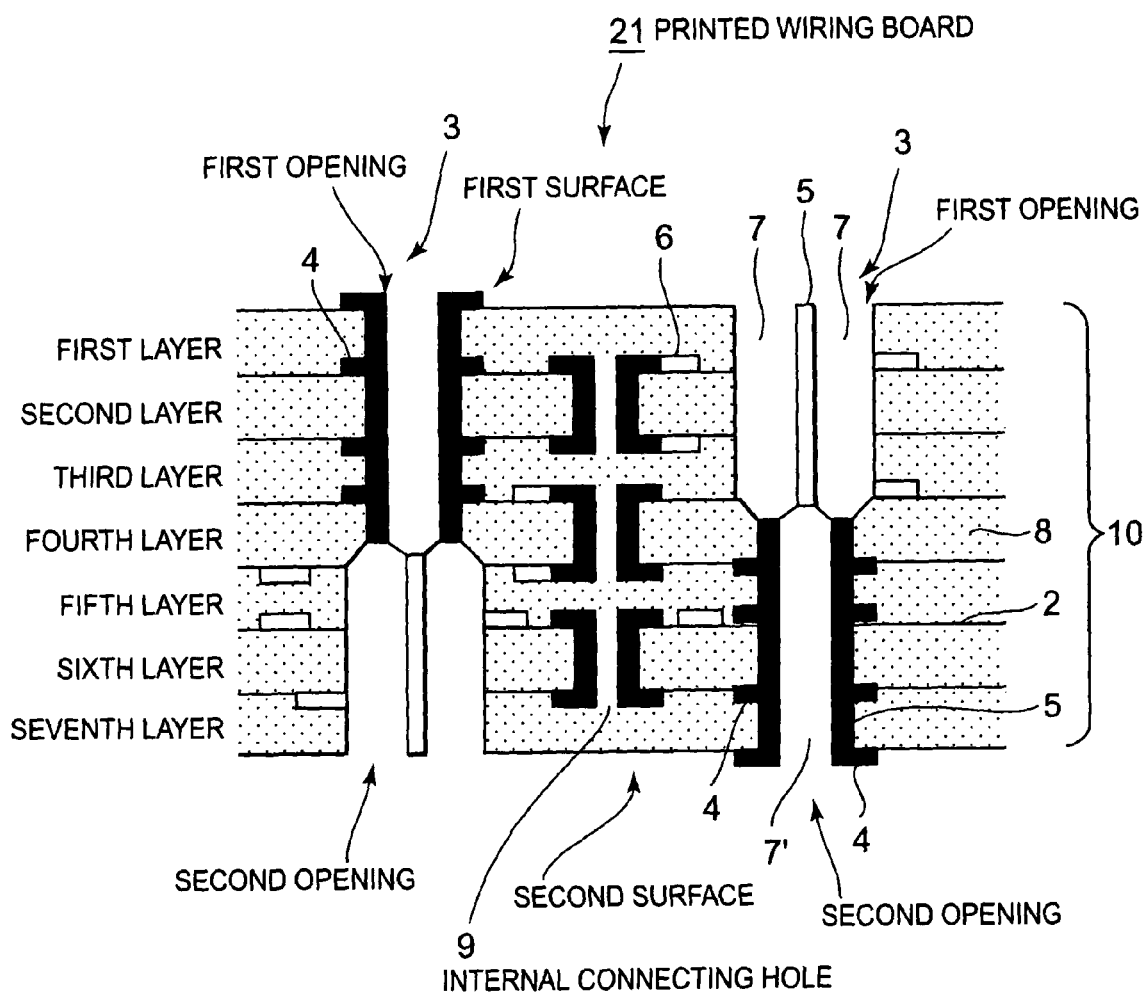
FIG. 7 is a drawing for showing the land, the conductive wall and an internal connecting hole in a second exemplary embodiment.

The second exemplary embodiment of the present invention is described referring to FIG. 7. FIG. 7 is a drawing showing the structure of the land 4, conductive wall 5 and an internal connecting hole 9. The second exemplary embodiment possesses substantially the same structure as the printed wiring board 1 of the first exemplary embodiment described above, but differs in the point where the internal connecting hole 9 is formed on the printed wiring board 21 and the number of layers in the printed wiring board 21.

As shown in FIG. 7, the insulation layer 8 and the internal circuit layer 2 are arrayed alternately in the printed wiring board 21, and these are laminated together to form the multilayer board. The printed wiring board 21 includes seven layers formed as the insulation layer 8 within the laminated board 10, and six internal circuit layers 2 formed between each layer. The through hole 3 is piercing substantially perpendicularly through the board surface of the laminated board 10. The through hole 3 is formed at optional positions on the printed wiring board 21. The lands 4 are formed on the respective first and second openings of the through holes 3. The conductive wall 5 connected to the lands 4 is formed on the interior wall of the through hole 3. The cut holes 7 and 7' that cut through the conductive wall 5 and the lands 4, are each formed at two respective locations at the lands 4, at the first and second openings of the through holes 3. An internal connecting hole 9 is formed inside of the printed wiring board 21. In the second exemplary embodiment, the case was described where the insulation layer 8 and the internal circuit layer 2 were placed alternately within the laminated board 10, and these layers were all laminated together as the printed wiring board 21. However this is merely an example and is not limited to the case. The structure as differing from the first exemplary embodiment is described in detail referring to FIG. 7.

The internal circuit layer 2 is a wiring circuit formed by the pattern 6, within the laminated board 10. The internal circuit layer 2 connects an electronic component (not shown in drawing) and another electronic component (not shown in drawing) mounted on the printed wiring board 21. Six internal circuit layers 2 are formed within the laminated board 10 as shown in FIG. 7. Also, the lands 4 are formed at specified locations on the internal circuit layers 2 as shown in FIG. 7. Connecting the pattern 6, the lands 4 and the conductive wall 5, the internal circuits 6 located on the different layer are connected each other. An internal connecting hole 9 is formed at a specified location on the internal circuit layer 2, and connects these internal circuit layers 2. In the second exemplary embodiment, the case was described where the six internal circuit layers 2 were formed, but this is merely an example and the number of internal circuit layers 2 is not limited to 6.

The cut holes 7 and 7' employ essentially the same structure as the first exemplary embodiment. However the cut holes 7 and 7' differ from the first exemplary embodiment in the point that they are drilled up through the fourth layer of the printed wiring board 21, and the conductive wall is insulated entirely at the fourth layer in the axial direction of the through hole 3.

The conductive wall 5 is also substantially the same structure as the first exemplary embodiment but differs in the point that the conductive wall 5 is divided within the fourth layer of the printed wiring board 21.

The internal connecting hole 9 is an interstitial via hole (IVH) that connects the internal circuit layers 2 formed at specified layers, without penetrating through the printed wiring board 21. In the second exemplary embodiment, internal connecting holes 9 are formed within the second layer, the fourth layer, and the sixth layer of the printed wiring board 21. Since the through hole 3 is divided in the axial direction of the through hole 3 at the internal layer (the fourth layer, for example), it is impossible that a first surface (shown in FIG. 7) and a second surface (shown in FIG. 7) are electrically connected by the through hole 3. However, with the internal connecting hole 9, it is possible that the first surface and the second surface are electrically connected through the internal circuits 6 connected to the internal connecting hole 9, without the through hole 3. Therefore, the other through hole 3 which does not include the cut holes 7 and 7' does not need to connect the first surface and the second surface. Electronic components can therefore be mounted at a high density on the multilayer printed wiring board.

The multilayer printed wiring board of the first embodiment of this invention including: a laminated board formed with an internal circuit layer, through holes penetrating toward the laminated layers of the laminated board, lands formed on both through hole openings, and a conductive walls connecting between the lands formed in the internal walls of the through holes, is characterized in that a cut hole is formed by cutting out a section of the conductive wall from at least one of the top/bottom surfaces of the multilayer printed wiring board towards the interior and, that a specified layer of the conductive wall is insulated. In this structure, a specified layer of the conductive wall can be insulated because the conductive wall is cut by forming by a hole by cutting from the surface side of the multilayer printed wiring board towards the interior. Different signal circuits can in this way be formed on the top and bottom of the through holes, and different electronic components can be mounted at identical top and bottom board positions on the multilayer printed wiring board. Electronic components can therefore be mounted at a high density on the multilayer printed wiring board.

The multilayer printed wiring board of the first embodiment of this invention including: a laminated board formed with an internal circuit layer, through holes penetrating toward the laminated layers of the laminated board, lands formed on both through hole openings, and a conductive walls connecting between the lands formed in the internal walls of the through holes, is characterized in that a specified layer of the conductive wall is insulated by forming cut holes by cutting at least a section of the conductive wall without penetrating the laminated board, on the top and bottom surfaces of the multilayer printed wiring board. This structure serves to completely cut the entire conductive wall by way of a section cut on the conductive wall by a cut hole formed on the top surface of the multilayer printed wiring board, and by way of a section cut on the conductive wall by a cut hole formed on the bottom surface, that both overlap on a specified layer. Different signal circuits can in this way be formed on the top and bottom of the through holes, and different electronic components can be mounted at identical top and bottom board positions on the multilayer printed wiring board. Electronic components can therefore be mounted at a high density on the multilayer printed wiring board.

The multilayer printed wiring board is also characterized in that a cut hole is formed along the through hole. The conductive wall within the through hole can in this way be cut along the laminations (stacked layers). In other words, the cut hole can be formed by a simple method since it is formed perpendicular to the laminated board surface.

The multilayer printed wiring board is also characterized in that when multiple signal circuits are connected to the land, along with cutting a section of the land by way of the cut hole, that hole is positioned so as to isolate each signal circuit and, separate the lands and the conductive wall. The structure therefore functions to isolate each signal circuit by way of the lands and conductive walls that remaining after the subdivision. One land and one through hole can in this way be allotted to the multiple signal circuits. Electronic components can therefore be mounted at a high density on the multilayer printed wiring board.

The multilayer printed wiring board is also characterized in that one of the subdivided lands and conductive walls isolated for use as a signal circuit is utilized for power supply. The conductive wall in the vicinity of the power supply signal circuit in this way reaches an inductive state where the electrical currents mutually cancel out to allow impedance matching within the through hole. Signal reflection can therefore be inhibited with a simple method and high-speed signal transmission achieved.

The multilayer printed wiring board is also characterized in that internal connecting holes are formed inside the laminated board for mutually connecting (interlayer) circuits among the different internal layers. The structure functions to connect between circuits formed internally in specified layers and also connect the top and bottom of the multilayer printed wiring board by way of internal connecting holes, even if the conductive wall is subdivided into specified layers within the through hole, and isolated signal circuits are formed on the top and bottom. The top and bottom of the multilayer printed wiring board can therefore be connected without forming new through holes. Electronic components can therefore in this way be mounted at a high density on the multilayer printed wiring board.

A method for manufacturing the multilayer printed wiring board of another embodiment of this invention is characterized in that a first process collectively forms a multilayer printed wiring board including through holes penetrating through the laminated boards by collectively laminating the respective laminated boards where internal circuit layers are internally formed, and a second process for forming cut holes by cutting a section of the conductive wall along the interior from at least one direction of the top and bottom surfaces of the multilayer printed wiring board, to insulate the conductive wall into specified layers.

A method for manufacturing the multilayer printed wiring board of another embodiment of this invention is characterized in that a first process collectively forms a multilayer printed wiring board including through holes penetrating through the laminated boards by collectively laminating the respective laminated boards where internal circuit layers are internally formed, and a second process forms the cut holes respectively from the top side and bottom side of the multilayer printed wiring board by cutting a section of a conductive wall formed on at least the internal wall of the through hole, without penetrating through the laminated board.

The second process is characterized by forming a cut hole along the through hole. The second process is characterized by forming cut holes at respectively different positions on the top and bottom of the through holes.

The second process is characterized by cutting the lands by way of the cut holes, and positioning the cut holes so as, to isolate each of the signal circuits, and subdivide the lands and conductive walls when connecting multiple signal circuits to the lands.

The method for manufacturing the multilayer printed wiring board is also characterized in including a process for forming internal connecting holes inside, the laminated boards, for mutually connecting the internal circuit layers formed in the different layers prior to the first process.

The present invention possessing the above described functions is therefore capable of dividing the conductive wall 5 in the axial direction of the through hole 3. Different signal circuits can be therefore formed at the top and bottom of the through hole 3, and different electronic components can be mounted at identical top/bottom positions on the printed wiring board to permit high density component mounting, so the present invention therefore possesses functions superior to the related art.

What is claimed is:
1. A board, comprising:
   a through hole including a first opening, a second opening opposite to said first opening;
   a first conductor formed on a part of said through hole, said first conductor extends from said first opening to a first predetermined position of said through hole;
   a second conductor formed on a part of said through hole, said second conductor extends from said second open- ing to a second predetermined position nearer to said second opening than said first predetermined position; and a first cut hole, at least partially offset from said second opening and extending from said second opening to a depth of the second predetermined position, the first cut hole thereby separating the first conductor and the second conductor, wherein said first conductor alternates with said second conductor with respect to the circumferential direction of said through hole.

2. The board according to claim 1, wherein said first conductor is separated from said second conductor with respect to said circumferential direction.

3. The board according to claim 1, wherein said first conductor and said second conductor are formed so that a sum of a length of said circumference direction of said first conductor and said second conductor is substantially equal to a perimeter of said through hole.

4. The board according to claim 1, wherein said first conductor comprises a plurality of discrete parts; and
wherein said second conductor comprises a plurality of discrete parts.

5. The board according to claim 4, wherein each of said discrete parts of said first conductor alternates with each of said discrete parts of said second conductor with respect to said circumferential direction.

6. The board of claim 1, wherein said first conductor alternating with said second conductor with respect to the circumferential direction of said through hole is such that there is no overlap, meaning that, for any point along a circumference of said through hole, there is at most one of said first conductor and second conductor that would project onto said point on the circumference along a direction of a centerline of said through hole.

7. The board of claim 1, wherein said first conductor alternates with said second conductor with respect both to a circumferential direction of said through hole and to an axial direction of said through hole.

8. The board of claim 1, wherein said first conductor alternates with said second conductor with respect to the circumferential direction of said through hole by reason that a material of said second conductor has been removed below said first predetermined position of said through hole by drilling said first cut hole.

9. The board of claim 8, wherein said first conductor alternates with said second conductor with respect to the circumferential direction of said through hole also by reason that a material of said first conductor has been removed above said second predetermined position of said through hole by drilling a second cut hole.

10. The board of claim 1, further comprising a second cut hole, at least partially offset from said first opening and extending from said first opening to a depth of the first predetermined position, the first cut hole thereby separating the first conductor and the second conductor, wherein diameters of said first cut hole, said second cut hole, said first opening, and said second opening are substantially equal, thereby said first conductor and said second conductor are formed so that a sum of a length of said circumference direction of said first and second conductor is substantially equal to a perimeter of said through hole.

11. The board of claim 1, the first conductor alternating with said second conductor thereby permitting a first component to be mounted in the first opening on one surface of the board and a second component to be mounted in the second opening on the opposite surface of the board without interference or electrical contact between said first component and said second component.

12. An apparatus including a board, said board comprising:
a through hole including a first opening, a second opening opposite to said first opening;
a first conductor formed on a part of said through hole, said first conductor extends from said first opening to a first predetermined position of said through hole;
a second conductor formed on a part of said through hole, said second conductor extends from said second opening to a second predetermined position nearer to said second opening than said first predetermined position; and
a first cut hole, at least partially offset from said second opening and extending from said second opening to a depth of the second predetermined position, the first cut hole thereby separating the first conductor and the second conductor,
wherein said first conductor alternates with said second conductor with respect to the circumferential direction of said through hole.

13. The apparatus according to claim 12, wherein said first conductor is separated from said second conductor with respect to said circumferential direction.

14. The apparatus according to claim 12, wherein said first conductor and said second conductor are continuously formed with respect to said circumferential direction.

15. The apparatus according to claim 12, wherein said first conductor comprises a plurality of discrete parts; and
wherein said second conductor comprises a plurality of discrete parts.

16. The apparatus according to claim 15, wherein each of said discrete parts of said first conductor alternates with each of said discrete parts of said second conductor with respect to said circumferential direction.

* * * * *